United States Patent [19]

Gridley et al.

[11] 4,259,576
[45] Mar. 31, 1981

[54] ANTI-BLOOMING SHIELD FOR TWO-DIMENSIONAL CHARGE-INJECTION DEVICES

[75] Inventors: C. John Gridley, Silver Spring; Donald L. Weinberg, Oxon Hill, both of Md.

[73] Assignee: The United States of America as represented by the Secretary of the Navy, Washington, D.C.

[21] Appl. No.: 67,646

[22] Filed: Aug. 17, 1979

[51] Int. Cl.³ .......................... G01J 1/00; G01T 1/22
[52] U.S. Cl. ................................... 250/338; 250/349; 250/370
[58] Field of Search ............... 250/338, 339, 349, 370, 250/371; 357/32

[56] References Cited

U.S. PATENT DOCUMENTS

| | | | |
|---|---|---|---|
| 2,428,537 | 10/1947 | Veszi et al. | 357/32 |
| 4,029,962 | 6/1977 | Chapman | 250/370 |
| 4,054,797 | 10/1977 | Milton et al. | 250/370 |

Primary Examiner—Alfred E. Smith
Assistant Examiner—Janice A. Howell

Attorney, Agent, or Firm—R. S. Sciascia; W. T. Ellis; M. L. Crane

[57] ABSTRACT

A shield or opaque covering for reducing blooming at low input levels in two-dimensional charge-injection devices. Two-dimensional charge-injection devices include X-Y aligned detector elements in which each detector element includes a y-electrode portion and a x-electrode portion, each in the same alignment. Each of the y-electrode portions in the same vertical column is connected to a common conductor to form separate y-electrode column conductors, one for each column of elements. Each of the x-electrode portions in the same horizontal row is connected to a common conductor thereby forming separate rows of x-electrode conductors, one for each row of elements. During fabrication each of the rows of y-electrode portions is permanently covered with a covering which is opaque to the radiation to be detected whereas each of the x-electrode areas is exposed to the radiations to be detected. Such an arrangement permits read-out of individual detector elements without blooming by nearby detector elements at low inputs.

5 Claims, 3 Drawing Figures

ANTI-BLOOMING SHIELD FOR TWO-DIMENSIONAL CHARGE-INJECTION DEVICES

BACKGROUND OF THE INVENTION

This invention relates to charge-injection-devices (CID), based on, e.g., indium antimonide, used in self-scanned infrared image detectors and more particularly to such a device in which blooming at low input levels is reduced without loss of sensitivity by shielding the y-electrodes of each detector. Heretofore multi-element detectors have been formed wherein each detector element had one contact and one lead connected to each detector. Such devices required many electrically conductive wires outside the CID, which are cumbersome, use a lot of space, and add weight to the system. Most of the electrical wires have been eliminated in a two-dimensional single-column structure in which the output of each detector is connected to a common conductor and the detector elements are scanned by a shift register to read out each detector in order.

Presently two-dimensional charge-injection devices have been made into an array having, for example, sixteen by twenty-four detector elements. Each detector element has two contacts, each of which has a lead that connects with a shared conductor. The number of conductors is comparable only to the number of detector rows and columns. For instance, the detector array with 16×24 elements will have 16 row leads and 24 column leads with the x-electrode of each detector element connected to a row lead and the y-electrode of each detector element connected to a column lead. The column leads are connected to a common conductor which is connected to a signal preamplifier followed by appropriate electronic circuitry and a suitable display or automatic recognition device. The x-electrode of each element of each row is gated by a row shift-register and the outputs to the column leads for each column of elements are gated by a column shift-register.

The prior art array is formed by 16×24 elements each of which has both of its contact areas exposed to the image excitation radiation. Infrared radiation generates hole-electron pairs in the substrate and minority carriers are collected in potential wells, one associated with each electrode. When the charge in one y-electrode is read out, all the rest of the y-electrodes in that column are also read out, because they are connected together electrically to a common conductor.

In order that signal-charge be read out at a time identifiable by the external circuitry with its image element of origin, distinguishable in particular from other image elements belonging to the same column, the signal charge must be stored at the x-electrode, and then transferred to the y-electrode for read-out by application of suitable voltage pulses to the x- and y-electrode leads, at the proper time for read-out. For example, if the signal charge is initially integrated at a y-electrode, it must be transferred to the x-electrode for storage, and then back to the y-electrode for read-out, becuase the y-electrodes are the ones connected to the output circuitry. It has been determined that in an array such as set forth above only about 20% of the charge is transferred from the x-electrode to the y-electrode or vice versa, and the other 80% is lost. High transfer efficiency is one of the most difficult properties of a CID to achieve in fabrication. The state-of-the-art of other types of CID's for infrared imaging is believed to be similarly poor. The resultant efficiency of two successive transfers is so low that signal charge initially integrated at a y-electrode contributes almost nothing to the useful image. That signal charge can not ordinarily be identified by the external circuits with the image element of its origin, but only spuriously with some other image element of the same column, because of blooming. Thus, the signal charge integrated at a y-electrode manifests itself as a spurious localized output, in case of a very short pulse of illumination, or a blooming of the whole column, in case of steady illumination. In summary, integration at the y-electrodes does not contribute to a faithful image, but is a deleterious source of blooming.

The operation of such a two-dimensional CID requires many transfers of signal charge back and forth between the two electrodes of each image element, before the signal charge is finally read out. Since all of the x-electrodes in any row of imaging elements are connected to the same row conductor, it follows that a voltage pulse applied to a row conductor for the purpose of transferring charge from one x-electrode to its companion y-electrode will also have that effect in the other image elements of the row. Therefore, whenever charge is transferred from the x- to y-electrode of any image element, the other image element in the same row are similarly transferred, thereby losing most of their integrated signal charge. It follows that the image elements effectively integrate signal charge only for a time equal to the time between read-outs of the same row in successive columns. The limitation of the integration time to this relatively short time, rather than to the relatively long time required to read out all image elements, prevents a steady input from being integrated for a long time at the x-electrode until it produces a large output which could predominate over the blooming associated with integration at the y-electrode.

SUMMARY OF THE INVENTION

This invention prevents blooming at low input levels in a charge-injection device used as a self-scanned infrared-image detector. In the process of fabricating the array, each of the detector elements or pixels of the detector array is divided into a y-electrode area and a x-electrode area. In the invention, the y-electrode area and immediately adjacent areas of each of the detector elements of the array are covered with an opaque material to prevent their exposure to incident infrared radiation. Thus, only the x-electrode areas of each detector element of the array are exposed to infrared radiation and collect a signal charge due to the incident radiation. The signal charge is transferred to the y-electrode area for read-out. The opaque layer serves to remove blooming at those levels of irradiation which are insufficient to saturate the storage capability of the image sensor elements.

DETAILED DESCRIPTION OF THE INVENTION

Figure 1:
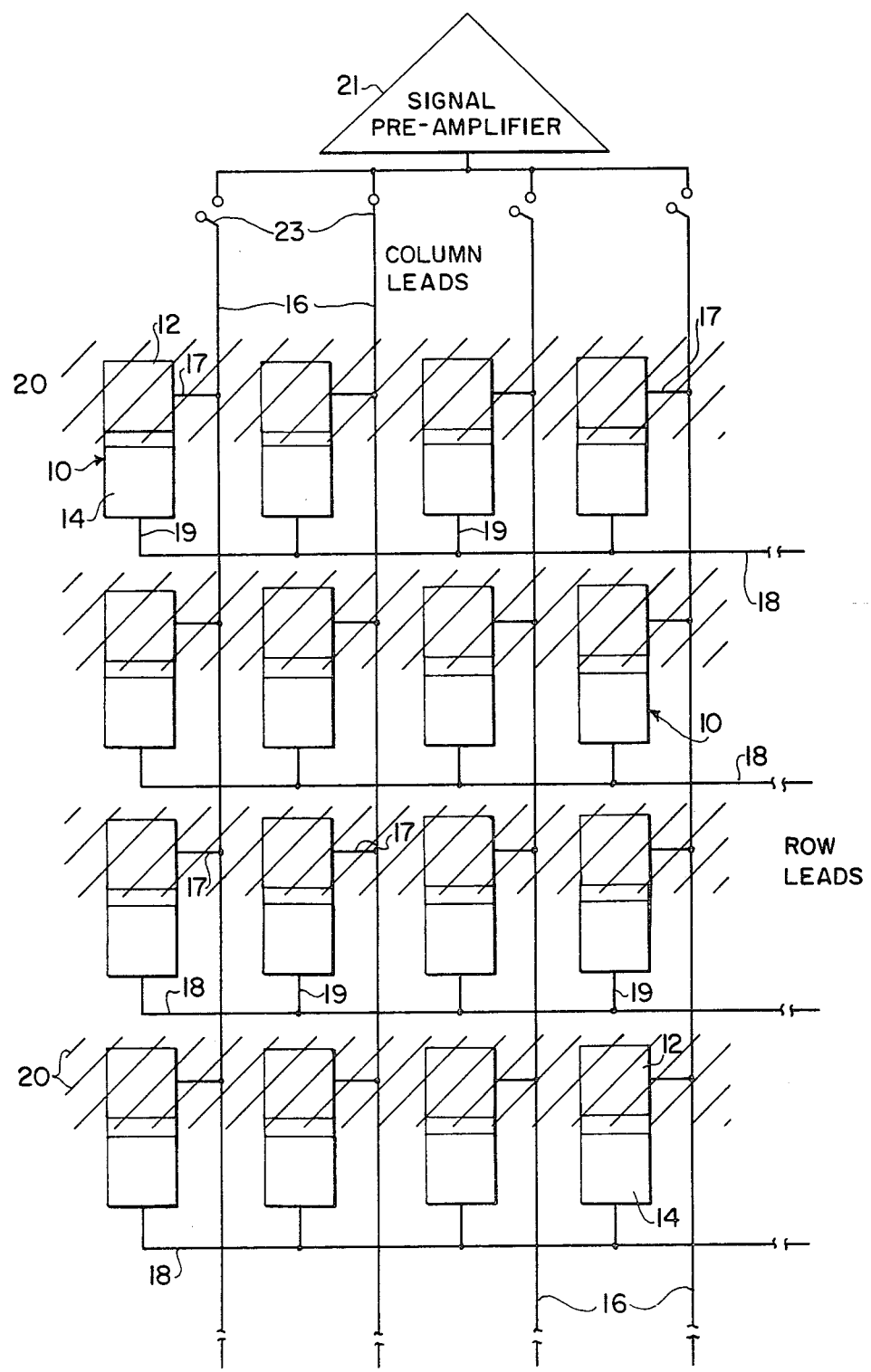
FIG. 1 is a simple illustration of a portion of an array of infrared detector elements shown with one column of y-electrodes connected electrically to a signal preamplifier.

FIG. 1 illustrates a portion of a charge-injection device detector array such as indium antimonide detectors, for detecting infrared radiation. The detector array is shown with sixteen detector elements 10 each including a y-electrode 12 and x-electrode 14. Each of the y-electrodes 12 of the same column is connected to a column conductor 16 by leads 17 and each of the x-electrodes 14 of the same row is connected to a row conductor 18 by leads 19. The column conductors 16 are successively connected electrically to a preamplifier 21 by use of electronic switches 23. The y-electrodes are so designated because they connect with column conductors which extend in the y-direction and the x-electrodes are so designated because they connect electrically with the row conductors which extend in the x-direction. The detector elements are fabricated so that they are in alignment in the x and y direction. Therefore there are as many column conductors 16 as there are columns of elements (y-direction) and as many row conductors 18 as there are rows of elements (x-direction). Each detector element includes a y-electrode and a x-electrode aligned in the y-direction. The y-electrodes are aligned in rows in the x-direction and the x-electrodes are also aligned in rows in the x-direction as shown in FIG. 1.

The y-electrodes and the areas nearby are covered with a material 20, represented by hash-marks, which is not transparent to infrared radiation. Gold or any other suitable material may be used which is not transparent to infrared radiation and which will allow the detector elements to function as desired. Since one portion of each detector element is covered with a material which is not transparent to infrared radiation, only the remaining portion of each detector element is exposed to detect incident infrared radiation.

The array of detectors may be made with as many detector elements as desired. This invention will be directed to a detector array having 384 detectors with twenty-four columns and sixteen rows of detectors.

Ingots of n-type InSb single crystals, for example, doped in the range of from $10^{14}$ to $10^{15}$ cm$^{-3}$ are used to form the detector array. The ingots are sliced into wafers and polished to a mirror-like surface. The wafers are then polished further in a lactic-nitric acid solution and subsequently coated with a SiOn dielectric layer having a thickness of about 5000 Å. The oxide-coated wafers are inspected for particle inclusions, defects and uniformity prior to their first oxide thinning process. Also, sample wafers from each deposition are tested for initial oxide/substrate interface adherence and their capacitance-voltage characteristics are measured. After inspection and approval of the wafers, the wafers are coated with a Kodak negative photoresist, precured in nitrogen, exposed and developed to form the detector areas and then spin dried. The wafers are then post-cured in nitrogen. The thin detector element areas are controlled to a thickness of about 1400 Å. The photoresist is then removed with microstripper and the wafers are rinsed in cascaded water and blown dry.

The wafers are loaded into a vacuum deposition device for deposition of the NiCr-Au thin film for the x-electrodes. The device is evacuated to about $5 \times 10^{-7}$ torr and the NiCr and gold are sequentially deposited. After metallization, the wafers are cooled in the vacuum and removed. The wafers are again photoresist-patterned to form the x-electrodes and the lead connections therefor. The infrared-transparent x-electrodes are formed by removing the gold.

After the x-electrode and lead connections have been formed, the wafers are loaded into an oxide reactor and an isolation oxide is deposited onto the structure.

The y-electrodes are then formed leaving about a 1000 Å isolation oxide coating between the x- and y-electrode regions. The thickness of the isolation oxide at the x-y crossover regions is about 3000 Å to minimize capacitive coupling.

The NiCr-Au thin film for forming the y-electrodes is deposited under the same conditions as set forth above for the x-electrodes. The y-electrodes and interconnections are formed by the same photoresist process. The gold layer of the y-electrodes is not removed so that the y-electrodes include a covering material 20 which is opaque to incident radiation.

The wafer with the formed x- and y-electrodes is protected by the deposition of a radiation-transparent oxide layer which protects against abrasion, moisture, etc.

Bonding pads are formed for bonding the x and y leads to which electrical conductors such as wires are connected for completing the detector system.

The completed InSb CID array set forth above may be formed as an array chip with the desired number of infrared detector elements wherein many such array chips may be formed on a wafer. In the above-described array chip, each of the elements is 2 mils by 2 mils. Including the spacing between the elements, the entire 16×24 element assembly has a dimension of about 42 mils by 72 mils.

Figure 2:
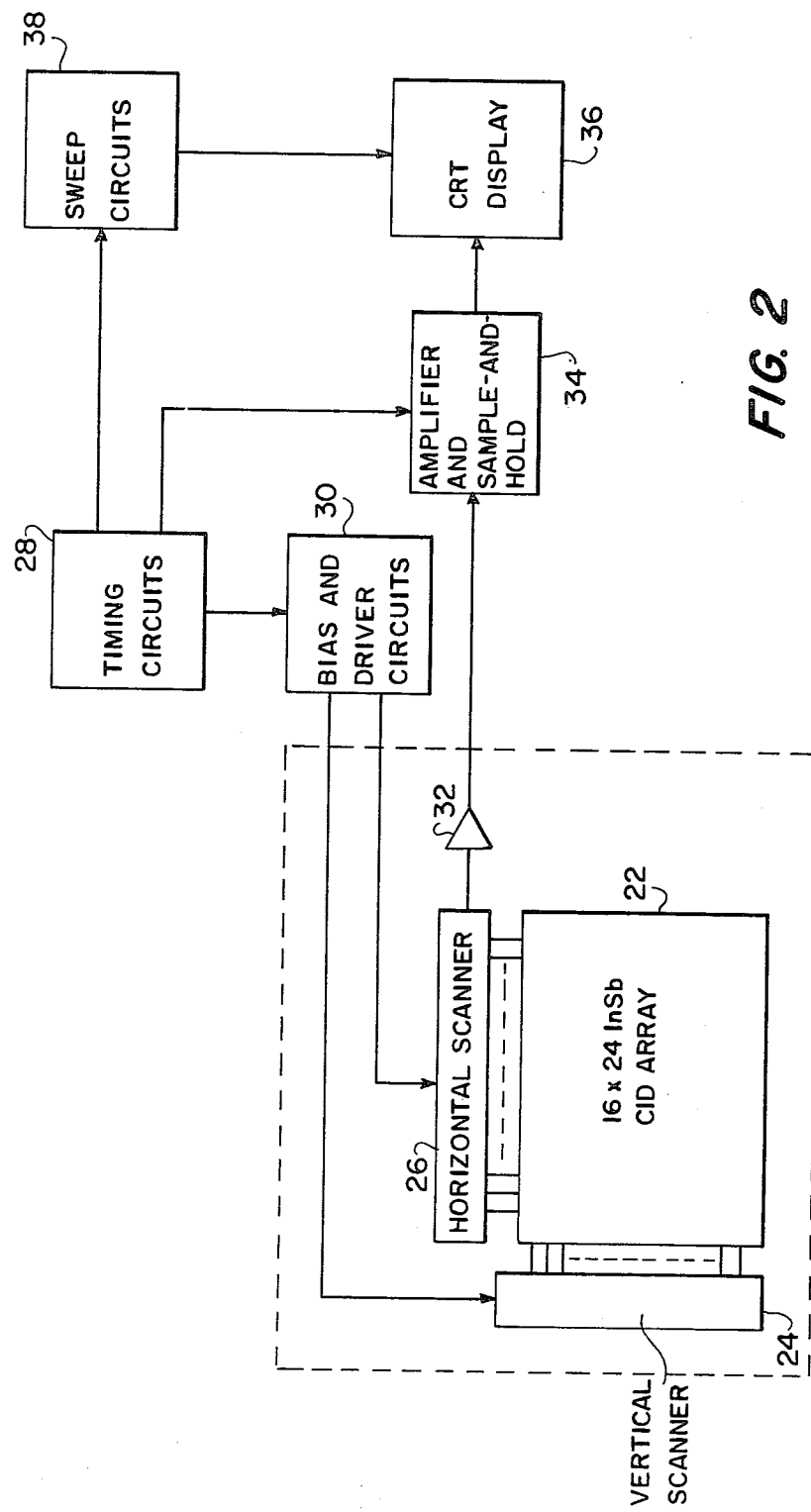
FIG. 2 illustrates a block diagram of an infrared detector array-display system.

FIG. 2 illustrates a block diagram of the array and the control system which enables use of the detectors for infrared image detection. The 16×24 InSb CID array 22 is scanned horizontally by a horizontal scanner 26 to sequentially select a column and vertically by a vertical scanner 24 to sequentially scan the elements in each column. As shown in FIG. 2, timing circuits 28 control the bias and driver circuits 30 for applying biasing and driving voltages to the detectors in timed sequence for storage of charges and for operation of the vertical and horizontal scanners for read out. The horizontal scanner selects the column whose detector outputs are amplified by preamplifier 32 and directed to an amplifier 34 which further amplifies the signals that are conducted to a cathode ray tube display 36 or any suitable analyzer or automatic processing equipment. The timing circuits also control sweep circuits 38 for the display device and control the sample-and-hold circuit.

In operation, the detector array is fixed in a Dewar and connected to the required electronic circuitry. Circuit boards may be used so that the detector array is snapped into place and properly connected to the electronic circuitry. The array is secured on a cold finger so that the array is cooled to a desired operating temperature of 77 K.

In carrying out the operation of the image detector suitable timing and sequencing circuits are necessary.

Figure 3:
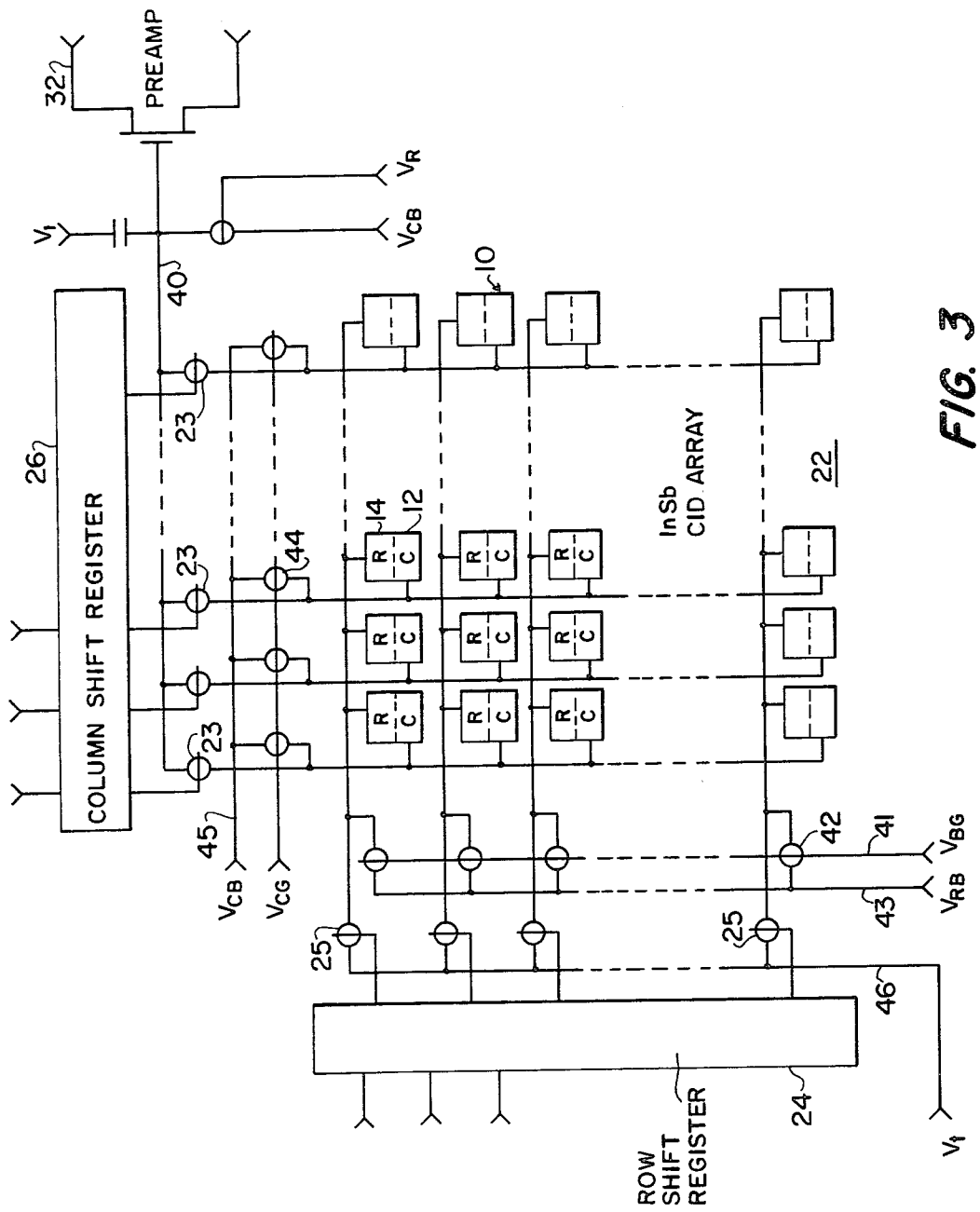
FIG. 3 illustrates a more detailed schematic diagram of a part of the system.

FIG. 3 illustrates in more detail the electrical connections for storage and read-out of the detector elements. Switches 42 are electronically closed simultaneously by a voltage source applied through conductor 41. The closed switches permit a voltage applied through conductor 43 to refresh a "high" steady voltage (one that produces a deep potential well under the electrodes) on the x-electrode areas of the detector elements. Similarly, the switches 44 are simultaneously closed electronically to permit a voltage through conductor 45 to refresh a "high" steady voltage on the column or y-electrode areas of the detector elements.

Infrared radiation incident on the detector array generates electron-hole pairs with the minority carrier holes stored as a positively charged layer at the insulator-semiconductor interface under the x-electrodes which are exposed to the radiation in the normal process of operation. Since the y-electrode areas are covered with a radiation-opaque material there will be no, or very little if any, charge build-up in the y-electrode areas due to incident radiation. Once the image has been detected, it is read out as follows: transfer voltage, $V_t$, is applied onto line 46 and is controlled by electronic switches 25 which are consecutively closed by the row shift register 24 in a properly timed sequence. The vertical or row shift register 24 is activated to pass a control voltage through the vertical shift register to the uppermost switch 25 for the first row of x-electrodes. The switch 25 for the first row of x-electrodes closes to permit a transfer voltage applied through line 46 to be applied to the first row of x-electrodes. The transfer voltage applies a "low" voltage (one that produces a shallow potential well under the electrodes) to the x-electrodes of each element of that row which causes the charges in the x-electrode areas of only that row to shift to the y-electrode areas because the y-electrode areas are still at "high" voltage. A voltage is applied through the column shift register to close the switch 23 for the first column of the y-electrodes. Since there is only one element in the selected column in which the y-electrode is at a "high" voltage and the x-electrode is at a "low" voltage, the charges from only the one element will be transferred through switch 23 along conductor 40, to the amplifier and to the processing device. There will be no blooming or transfer of charges from the other y-electrodes of the elements in the column because the charges have not been transferred from the x-electrode areas to the y-electrode areas.

The timer sequence opens the circuit through the vertical shift register and closes the circuits to the switches 42 and 44 to refresh the "high" voltage on the detector elements. The circuits to the switches 42 and 44 are opened and the vertical shift register shifts to the control for the next row of x-electrodes. A voltage through the shift register closes the electronic switch 25 for the second row which permits the transfer voltage to be conducted to the x-electrodes of the second row of conductors. The transfer voltage applies a "low" voltage to the x-electrodes of the detector elements of the second row to drive the stored charges to the y-electrode areas which are at a "high" voltage. The circuit to the column conductor is completed through closed switch 23 in the first column; therefore, the charges are carried off on the conductor to the preamplifier and to the precessing device.

After the last detector of the first column is read out the vertical scanner is reset and the column scanner shifts to the next column. The detectors of the second column are then sequentially read out, etc., until all columns and detectors have been read out. The row and column shift registers are shifted back to the first row and column and the scan is repeated as set forth above.

The timing circuits for the display control the signals to the display in the same order that the detectors are scanned so that the output signals are directed to the display in order. In this manner an image of the infrared scene received by the detectors will be displayed by the display device.

In order that the signal be read out at a time identifiable by the external circuitry with its image detector element of origin and distinguishable in particular from other image elements belonging to the same column, the signal must be stored at the x-electrode and then transferred to the y-electrode by application of suitable voltage pulses to the x- and y-electrode leads, and at the proper sequencing time for read out. The horizontal shift register insures that the proper circuitry is connected to the y-electrodes for read out in the proper timing sequence and the vertical shift register insures that the transfer voltage is applied to the x-electrodes in the proper timing sequence. Thus, the signal outputs can be identifiable with each respective detector element of the detector array because there is only one detector element which is selected simultaneoualy by the row and column shift registers.

In the case in which both the x- and y-electrodes are exposed to the incident radiation, charges are built up in each area of the detector element and the charges will be transferred to conductor 40 and the preamplifier whenever any element of that column is interrogated. Those charges that leak off those elements when not being interrogated are those that cause blooming.

The disclosure has been directed to the use of n-type InSb single crystals. It will be obvious that detectors may be formed by other materials such as (Hg, Cd)Te, (In,As)Sb, (Pb,Sn)Te, GaAs, InP as well as others. The detector array may be formed with any desired number of detector elements or different arrangements of detector elements. Further any suitable material which is not transparent to infrared radiation may be used to cover the y-electrodes. Other read-out sequences may be used.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. In an improved two-dimensional infra-red detector array including a plurality of aligned detector elements arranged in rows and columns in which each detector element includes a pair of spaced x- and y-electrodes defining respective potential wells within the detector elements, the array having means for simultaneously transferring any signal charge stored in the potential wells at all of the x-electrodes in any row of the array to the respective potential wells at the associated y-electrodes, and for thereafter simultaneously reading out any signal charge stored in the potential wells at all of the y-electrodes in any column of the array, the improvement comprising:

an infra-red opaque layer covering the y-electrode of each detector element of said detector array to prevent accumulation of signal charge in the potential wells at the y-electrodes when the array is irradiated by infra-red light, while permitting accumulation of signal charge in the potential wells at the x-electrodes, so that signal charge accumulated in the potential well at a given x-electrode can be transferred to the potential well at the associated y-electrode and thereafter read out from the potential well at the associated y-electrode without an accompanying spurious output from the potential wells of other y-electrodes in the same column.

2. In an improved infrared detector as claimed in claim 1 the improvement in which:

said opaque layer is a gold layer which may be deposited during manufacture of said infrared detector array.

3. In an improved infrared detector as claimed in claim 1, the improvement in which:

said detector array is formed from a material selected from the group consisting of InSb, (Hg,Cd)Te, (In,As)Sb, (Pb,Sn)Te, GaAs, and InP.

4. In an improved infrared detector as claimed in claim 1; the improvement in which:

the detectors in said array are formed of InSb.

5. In an improved infrared detector as claimed in claim 2; the improvement in which:

the detectors in said array are formed in InSb.

* * * * *